United States Patent [19]
Anjoh et al.

[11] Patent Number: 6,030,859
[45] Date of Patent: Feb. 29, 2000

[54] METHOD OF MAKING A PACKAGED SEMICONDUCTOR DEVICE AND A LEAD-FRAME THEREFOR

[75] Inventors: Ichiro Anjoh, Koganei; Gen Murakami, Tama, both of Japan; Michael Anthony Lamson, Van Alstyne; Katherine Gail Heinen, Dallas, both of Tex.

[73] Assignees: Hitachi, Ltd., Tokyo, Japan; Texas Instruments Incorporated, Dallas, Tex.

[21] Appl. No.: 08/818,730

[22] Filed: Mar. 14, 1997

Related U.S. Application Data

[63] Continuation of application No. 08/658,128, Jun. 4, 1996, Pat. No. 5,648,299, which is a continuation of application No. 08/451,267, May 30, 1995, Pat. No. 5,585,665, which is a continuation of application No. 07/989,956, Dec. 10, 1992, Pat. No. 5,442,233, which is a continuation of application No. 07/620,206, Nov. 30, 1990, abandoned.

[30] Foreign Application Priority Data

Dec. 1, 1989 [JP] Japan ..................................... 1-312401

[51] Int. Cl.[7] .................................................. H01L 23/31
[52] U.S. Cl. ............................................ 438/124; 257/670
[58] Field of Search .................................... 257/670, 675; 438/124, FOR 367

[56] References Cited

U.S. PATENT DOCUMENTS

| | | |
|---|---|---|
| 4,862,245 | 8/1989 | Pashby et al. . |
| 5,233,220 | 8/1993 | Lamson et al. . |
| 5,357,139 | 10/1994 | Yaguchi et al. . |
| 5,834,691 | 11/1998 | Aoki . |

FOREIGN PATENT DOCUMENTS

| | | |
|---|---|---|
| 56-122154 | 9/1981 | Japan . |
| 61-53752 | 3/1986 | Japan . |
| 61-144855 | 7/1986 | Japan . |
| 61-241959 | 10/1986 | Japan . |
| 63-174347 | 7/1988 | Japan . |
| 63-266842 | 11/1988 | Japan . |

*Primary Examiner*—George Fourson
*Assistant Examiner*—Joannie A. Garcia
*Attorney, Agent, or Firm*—Antonelli, Terry, Stout & Kraus, LLP

[57] ABSTRACT

A lead frame for a semiconductor IC device has a pair of common elongated leads and first and second groups of slender leads arranged on opposite sides of the common elongated leads and generally extending transverse to the common elongated leads. The common elongated leads have as their integral parts slender leads extending therefrom generally transverse thereto and substantially linear extensions from both ends of the common elongated leads. The linear extensions serve to firmly support a semiconductor chip to be packaged along with parts of the leads. The common elongated leads may further have as their integral parts projections extending from their sides for enhancement of the heat dissipation capability. A semiconductor chip may have bonding pads arranged thereon such that bonding wires and the common elongated leads do not cross each other for electrical connection between the common elongated leads and bonding pads of the semiconductor chip.

27 Claims, 8 Drawing Sheets

METHOD OF MAKING A PACKAGED SEMICONDUCTOR DEVICE AND A LEADFRAME THEREFOR

This is a continuation application of application Ser. No. 08/658,128, filed Jun. 4, 1996, now U.S. Pat. No. 5,648,299, which is a continuation application of application Ser. No. 08/451,267 filed May 30, 1995, now U.S. Pat. No. 5,585,665, which is a continuing application of application Ser. No. 07/989,956, filed Dec. 10, 1992, now U.S. Pat. No. 5,442,233, which is a continuation of application Ser. No. 07/620,206, filed Nov. 30, 1990, now abandoned.

BACKGROUND OF THE INVENTION

The present invention relates to a semiconductor device, and in particular to a semiconductor technology which is effectively applicable to packages of a large scale integrated circuit having a high packaging density.

Semiconductor chips have heretofore been molded to seal with a resin for protecting the same. Various methods are used for positioning and mounting the leads on the semiconductor chip prior to molding.

For example, a leadframe having a tab at a center thereof is used. In the prior art, a method of connecting electrode pads positioned in the vicinity of the periphery of a chip with corresponding inner leads by bonding wires has been known.

A common problem in prior art semiconductor packages resides in that cracks are formed along a parting line of a mold which is an exit of lead wires of a metal leadframe.

Another problem resides in that a path of invasion of environmental pollutant along the metal leads into the semiconductor chip from outside is relatively short.

A further problem resides in that bonding wires should not cross each other since bonding wires necessary to connect the inner leads with electrode pads of the semiconductor chip are relatively long and input/output terminals are alternately assigned thereto.

In order to overcome the above problems, a resin molded semiconductor device including a plurality of inner leads are bonded to the active area of the semiconductor chip with an insulating film interposed therebetween, in which the inner leads are electrically connected with the semiconductor chip through bonding wires, common inner leads (bus bar inner leads) are provided in the vicinity of a longitudinal central line of the active area of the semiconductor chip was proposed in JP-A-61-241959, laid open Oct. 28, 1986, which corresponds to U.S. Ser. No. 724,736 filed Apr. 18, 1985.

U.S. Ser. No. 07/373,742, filed Jun. 30, 1989 and assigned to Texas Instruments Inc., discloses a leadframe having a pair of elongated conductive buses and first and second groups of conductive leads arranged on opposite sides of the power buses, in which the areas of the conductive leads are substantially identical with each other, thereby providing a balanced capacitance.

Proceedings of the 1988 IEEE Electronic Components Conference, pp. 552–557 reports an area wire bond plastic structure in which a leadframe has lead strips extending into the center of the package in the form of leads and busbars. The leadframe is laminated directly to the surface of a chip.

Conventionally, a leadframe of the type having busbars (common leads) at its central portion includes support leads provided on an outer frame of the leadframe separately from leads serving as terminals for a semiconductor device on a semiconductor chip. This is for the purpose of supporting the semiconductor chip when the leadframe, having been properly positioned on the chip and molded, is subjected to cutting and shaping operations.

However, there is a difficulty that since heat dissipation may be insufficient at an area of the semiconductor chip where heat generation is high, this deteriorates the reliability of the semiconductor device.

SUMMARY OF THE INVENTION

It is an object of the present invention to provide a technology which is capable of enhancing the reliability of a semiconductor device.

It is another object of the present invention to provide a leadframe for semiconductor device having a simplified structure.

It is a further object of the present invention to provide a leadframe for a semiconductor device which can achieve enhancement of efficiency of generated heat dissipation.

It is a further object of the present invention to provide a technology which is capable of preventing short-circuiting between bonding wires and common inner leads.

It is a further object of the present invention to provide packaged semiconductor device having the above-mentioned leadframe.

In an aspect of the present invention, a semiconductor device comprises leads which serve purposes other than conducting electrical signals from common inner leads are disposed above portions other than a central portion of the active area of the semiconductor chip, so that these leads enhance the heat dissipation efficiency and also serve as support leads.

In another aspect of the present invention, the surface area of the common inner leads is made larger than that required for wire bonding, so that heat dissipation efficiency can be enhanced.

According to another aspect of the present invention, a leadframe for a semiconductor IC device has at least one elongated lead and first and second groups of slender leads arranged on opposite sides of the common elongated lead and generally extending transverse to the common elongated lead. The common elongated lead has as its integral parts substantially linear extensions from both ends of the common elongated lead. The linear extensions have a dual function of firmly supporting a semiconductor chip to be packaged along with parts of the leads and enhancing dissipation of heat which may be generated by the semiconductor chip. The common elongated leads may further have as their integral parts projections extending from their sides for enhancement of the heat dissipation capability. The above-mentioned linear extensions are arranged such that, when the leadframe is molded into a package along with a chip containing the semiconductor IC device, they are partly in contact with the chip.

In a further aspect of the present invention, bonding pads are arranged on an active area of a semiconductor chip such that the bonding wires provided on the active area of the semiconductor chip do not cross the common inner leads, so that, short-circuiting between the bonding wires for connecting a plurality of signal inner leads with the semiconductor chip and the common inner leads can be prevented.

DESCRIPTION OF THE PREFERRED EMBODIMENTS

Figure 1:
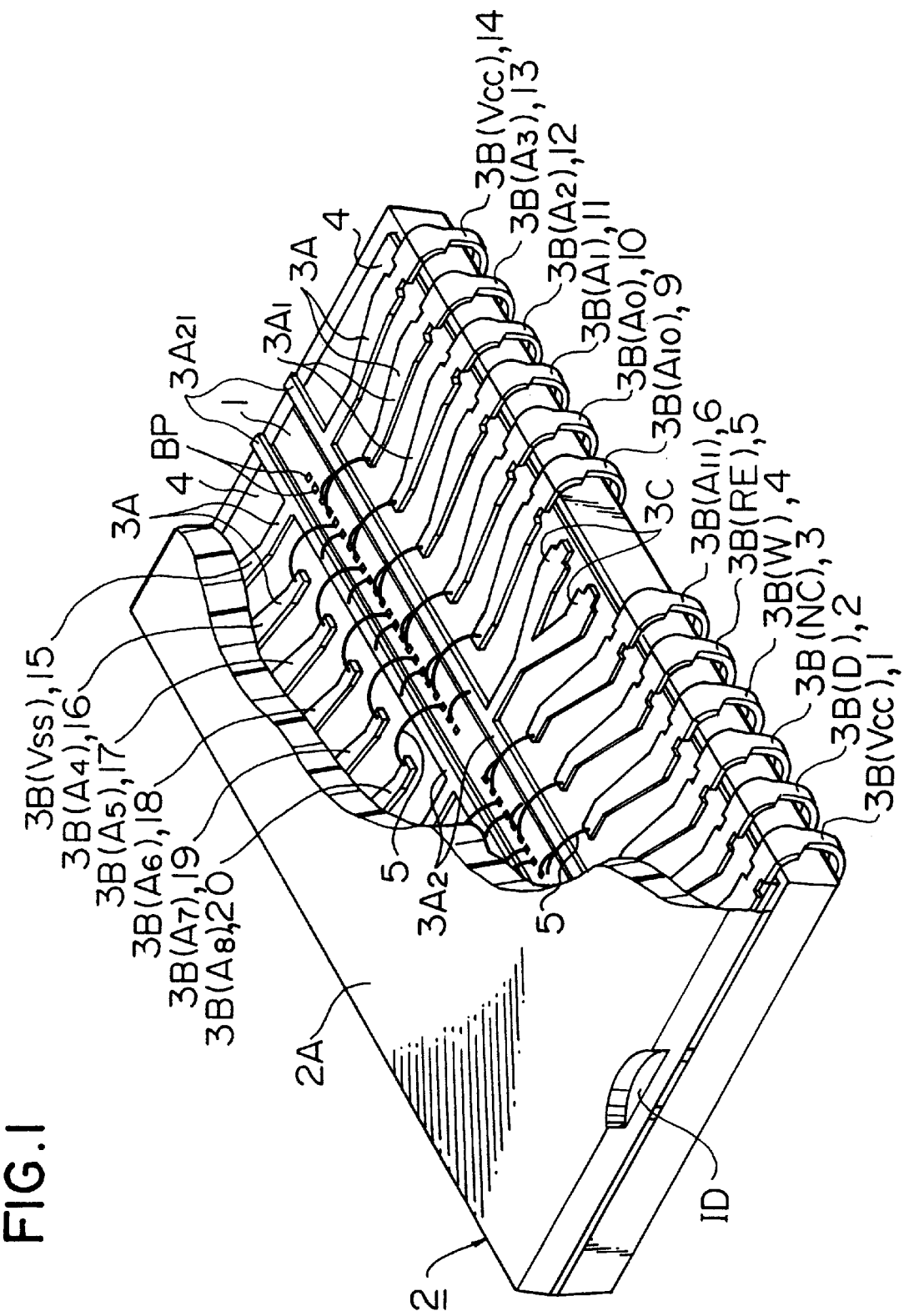
FIG. 1 is a partial sectional and perspective view showing an embodiment of a resin molded semiconductor device of the present invention in which a DRAM is molded.

An embodiment of the present invention will now be described in detail with reference to the drawings.

Like reference numerals denote parts having like functions through the drawings showing the embodiments and repeating of description of the like parts will be omitted for simplicity of description.

[Embodiment I]

Figure 2:
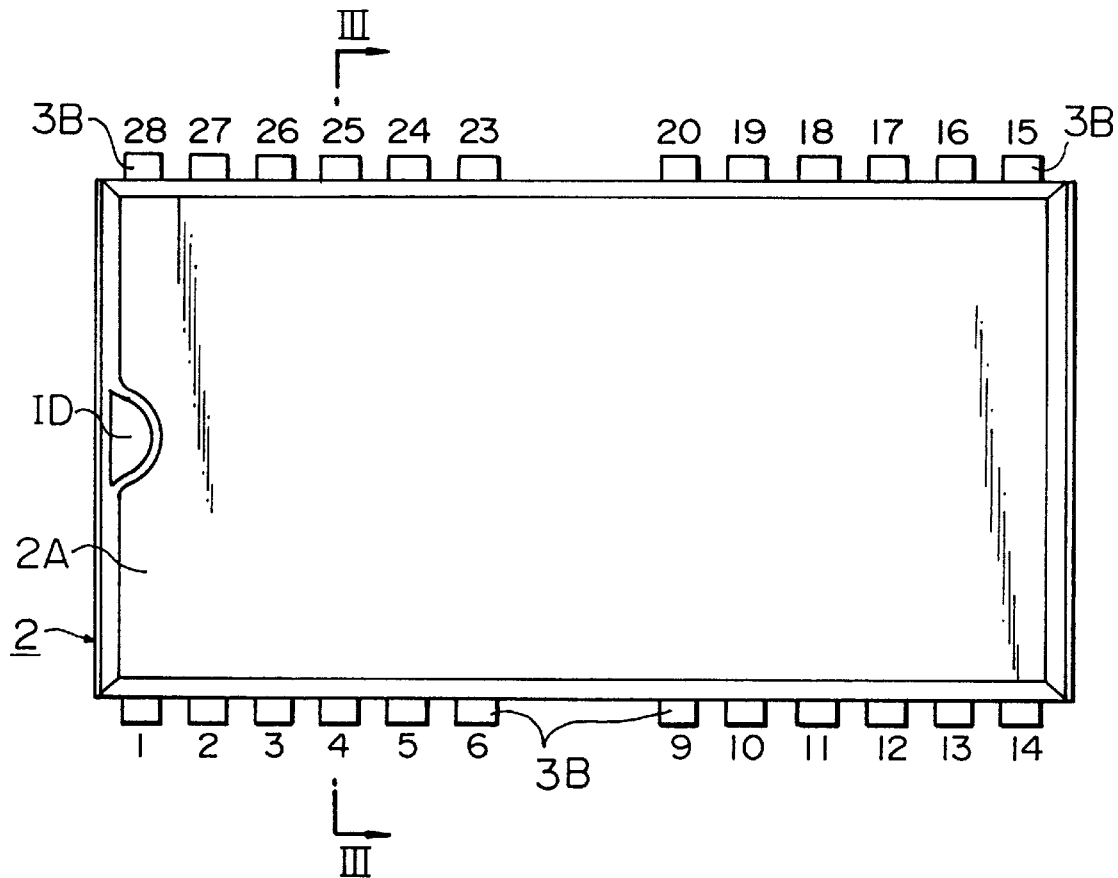
FIG. 2 is a plan view of the semiconductor device of FIG. 1.
Figure 3:
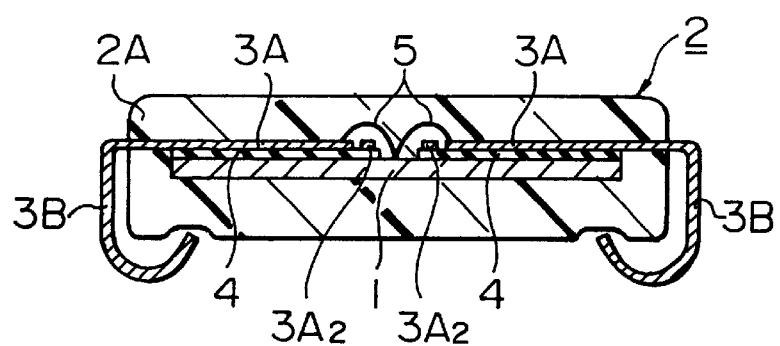
FIG. 3 is a sectional view taken along a line III—III in FIG. 2.

A resin molded semiconductor device in which a DRAM is molded with a resin, an embodiment I of the present invention is shown in FIG. 1 (partial sectional and perspective view), FIG. 2 (plan view) and FIG. 3 (sectional view taken along a line III—III in FIG. 2).

The DRAM 1 (semiconductor chip) is sealed by an SOJ (Small Outline J lead) type resin molded package 2. The DRAM 1 is formed so that it has a large capacity of 16 M bits×1 bit and has a rectangular shape 16.48 mm×8.54 mm in plan. The DRAM1 is sealed by a 400 mil resin molded package 2.

On an active area of the semiconductor chip (in which circuit means is formed), memory cell array units and peripheral circuits are mainly disposed. The memory cell array unit comprise a plurality of memory cells (memory elements) which are disposed in a matrix manner, each memory cell storing one bit of information as will be described in detail hereafter. The peripheral circuits comprise direct and indirect peripheral circuits which are directly and indirectly connected with memory cell array units, respectively. The direct peripheral circuit is adapted to directly control the read and write operation of information from and to the memory cells. The direct peripheral circuit includes a low address decoder circuit, a column address decoder circuit, sense amplifier circuit, etc. The indirect peripheral circuit is adapted to control the operation of the direct peripheral circuit and includes a clock signal generation circuit, a buffer circuit, etc.

Above the active area of the semiconductor chip, that is, the surface on which the memory cell array units and peripheral circuits are disposed, inner leads 3A are disposed. An insulating film 4 is interposed between the DRAM1 and the inner leads 3A. The insulating film 4 is formed from, for example, a polyimide resin film. An adhesive layer (not shown) is provided on each side of the insulating film 4 facing the DRAM 1 and the inner lead 3A, respectively. For example, polyether-amide-imide resins or epoxy resins are used for this adhesive layer. Such type of resin molded package 2 adopts an LOC (Lead On Chip) structure in which the inner leads 3A are disposed above the DRAM 1. Since the shape of the inner leads 3A can be freely determined without being restricted by the shape of the DRAM1 owing to the use of the resin molded package 2 in the LOC structure, a DRAM having a correspondingly larger size can be molded. In other words, since molding size (package size) can be suppressed small with the resin molded package 2 adopting LOC structure even when the DRAM1 has a larger size for an increased storage capacity, the packaging density can be increased.

The inner leads 3A are formed integrally with outer leads 3B at one end thereof. The outer leads 3B carry prescribed signals which are to be applied thereto and numbered according to standards. In FIG. 1, a right end and frontmost terminal as viewed in the drawing is terminal No. 1, and a right end and rearmost terminal is terminal No. 14. A left end and rearmost terminal is terminal No. 15 (the terminal No. is added to inner lead 3A) and a left end and frontmost terminal is terminal No. 28. The resin molded package 2 includes total 24 terminals such as terminals Nos. 1 through 6, terminals Nos. 9 through 14, terminals Nos. 15 through 20, terminals Nos. 23 through 28.

The terminal No. 1 is a power source voltage Vcc terminal. The voltage of the power source Vcc is, for example, an operation voltage 5 V for circuit. The terminal No. 2 is a data input signal terminal (D), the terminal No. 3 is a free terminal, the terminal No. 4 is a write enable signal terminal (W), the terminal No. 5 is a low address strobe signal terminal (RE), and the terminal No. 6 is an address signal terminal ($A_{11}$).

The terminal No. 9 is an address signal terminal ($A_{10}$); the terminal No. 11 is an address signal terminal ($A_1$); the terminal No. 12 is an address signal terminal ($A_2$); the terminal No. 13 is an address signal terminal ($A_3$); and the terminal No. 14 is a power source voltage Vcc terminal.

The terminal No. 15 is a reference voltage Vss terminal. The reference voltage Vss is, for example, a reference voltage 0 V for circuit. The terminal No. 16 is an address signal terminal ($A_4$); the terminal No. 17 is an address signal terminal ($A_5$); the terminal No. 18 is an address signal terminal ($A_6$); the terminal No. 19 is an address signal terminal ($A_7$); and the terminal No. 20 is an address signal terminal ($A_8$).

Although the terminals Nos. 23 through 28 are not shown, the terminal No. 23 is an address signal terminal ($A_9$); the terminal No. 24 is a free terminal; the terminal No. 25 is a column address strobe signal terminal (CE); the terminal No. 26 is a free terminal; the terminal No. 27 is a data output signal terminal; and the terminal No. 28 is a reference voltage Vss terminal.

The inner leads 3A traverse a long side of the rectangular shape of the DRAM1 at the other end thereof to extend to the center of the DRAM1. The tips of the inner leads 3A are connected at the other end thereof with the bonding pads (external terminals) BP which are arranged in the center of the DRAM1 through bonding wires 5. The bonding wires 5 are formed of an alminum (Al) wire. The bonding wires 5 may be gold wires, copper wires, coated wires including metal wires which are coated with an insulative resin on the surface thereof, etc. The bonding wires 5 are bonded by a bonding method in which thermo-compression bonding is carried out in combination with ultrasonic vibrations.

The inner leads (Vcc) $3A$ of the terminals Nos. 1 and 14 among the inner leads $3A$ are integrally formed and are elongated in the center of the DRAM1 in a parallel relationship with the long sides of the DRAM1. These inner leads (Vcc) $3A_2$ are referred to as common inner leads or bus bar inner leads. Similarly the inner leads (Vss) $3A_2$ of the terminals Nos. 15 and 28 are integrally formed and are elongated in the center of the DRAM1 in a parallel relationship with the long sides thereof. These inner leads (Vss) $3A_2$ are referred to as common inner leads or bus bar inner leads. The inner leads (Vcc) $3A_2$ and (Vss) $3A_2$ are extended in a parallel relationship with each other at the tip of the other inner leads $3A_2$ (signal inner lead $3A_1$) in a limited area. Each of the inner leads (Vcc) and (Vss) $3A_2$ is formed so that they can supply the power source voltage Vcc and the reference voltage Vss, respectively at any position on the active area of the semiconductor chip. That is, this resin molded semiconductor device is formed in such a manner that noise from the power source may be readily absorbed and speedup of the operation of the DRAM1 can be achieved.

Each of the common inner leads $3A_2$ has as its integral parts substantially linear extensions $3A_{21}$ from its ends. Thus, in the present embodiment, the DRAM1 has chip support leads $3A_{21}$ partly being in contact with the chip 1 and extending to the central portions of opposite two sides of the rectangular chip.

Dummy leads (heat dissipation leads) 3C which are not for conducting signals are provided at the center of the short sides of the rectangular shape of the DRAM1.

Each of the inner leads 3A, the outer leads 3B, the chip support leads $A_{21}$ and the dummy leads 3C is cut from a leadframe and is molded. The leadframe is formed of, for example, a Fe—Ni based alloy 1 (containing, for example, 42 or 50% of Ni) or copper, etc.

The DRAM1, bonding wires 5, inner leads 3A, chip support leads $3A_{21}$ and dummy leads 3C are molded with a resin 2A. The molding resin 2A comprises an epoxy resins to which a phenol curing agent, a silicone rubber and a filler are added for decreasing a stress therein. The silicone rubber has an effect to lower the thermal expansion coefficient of the epoxy resin as well as the modulus thereof. The filler is formed of spherical silicon oxide grains and also has an effect to lower the thermal expansion coefficient. An idex ID (a notch provided at the left end of the package 2 of FIGS. 1 and 2) is provided at a given position of the package 2.

The leadframe will now be described in detail.

Figure 4:
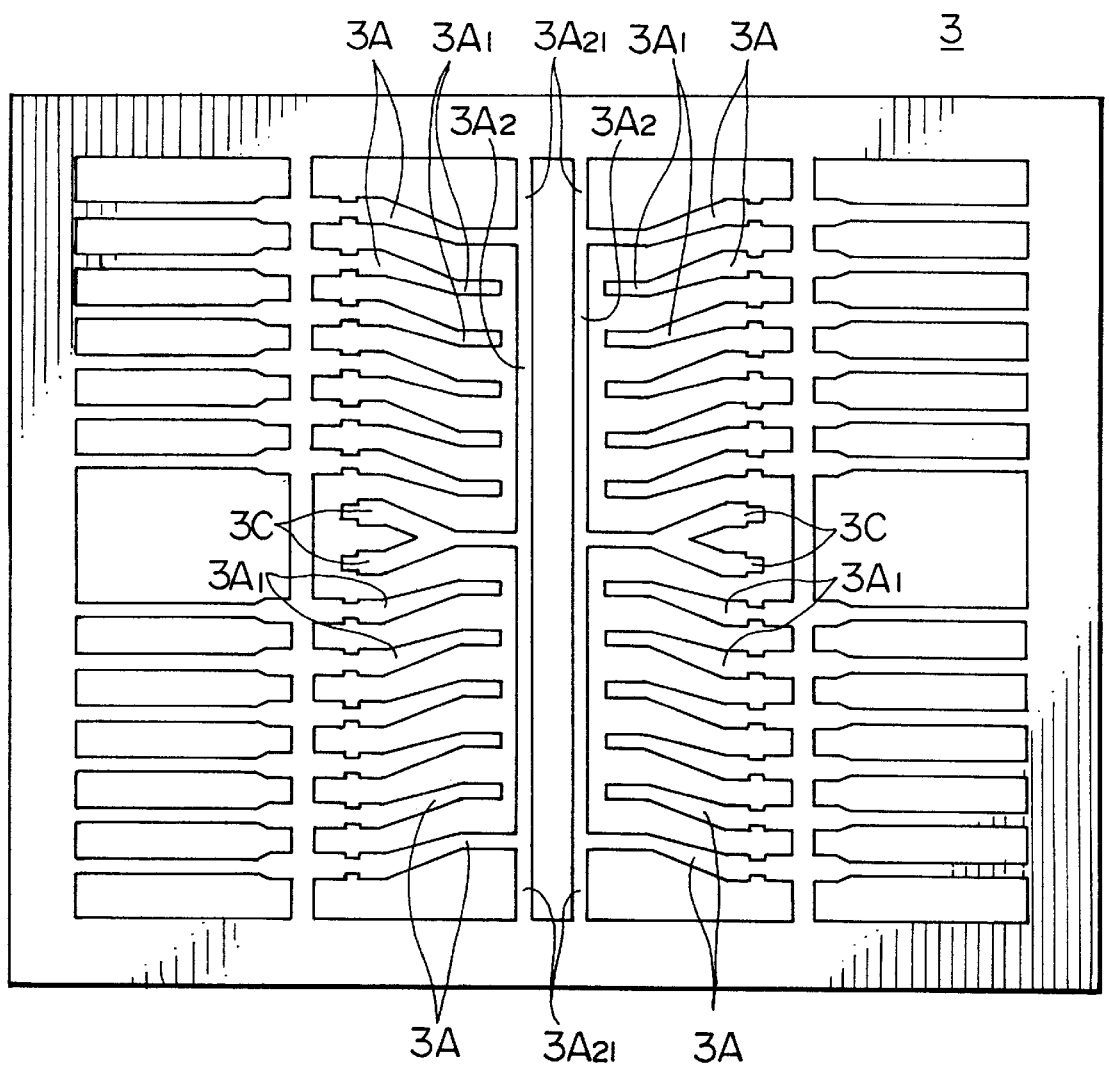
FIG. 4 is a plan view showing the entire of a leadframe shown in FIG. 1.

The leadframe of the present embodiment I is provided with 20 signal inner leads (two groups of slender leads) $3A_1$ and two elongated common inner leads $3A_2$ as shown in FIGS. 1 and 4 (plan view showing the entire of the leadframe).

The common inner leads $3A_2$ have, as their integral parts, chip support leads $3A_{21}$ at their predetermined portions, for example, in the form of extensions from the leads $3A_2$ for bonding and securing the active area of the semiconductor chip 1. The common inner leads $3A_2$ are positioned in the vicinity of a center line which is substantially parallel with one of the sides of the active area of the semiconductor chip 1.

Since bonding and securing the active area of the semiconductor chip 1 to the support lead $3A_{21}$ firmly secures the semiconductor chip 2, the enhancement of reliability and humidity resistance can be achieved.

Since the support leads $3A_{21}$ are formed integrally with the common inner leads $3A_2$, heat generated at the heating portion can be dissipated to outside.

The dummy leads (heat dissipation leads) 3C, which are not for conducting signals, are provided on a position at which the common inner leads 3A corresponds to the center of the longer sides of the rectangular DRAM1. The dummy leads 3C extend substantially transverse to the leads $3A_2$ and are integral therewith.

Since the dummy leads 3C are formed integrally with the common inner leads $3A_2$, heat generated from the heating portion can be efficiently dissipated to outside.

The signal inner leads $3A_1$, common inner lead $3A_2$ and dummy leads 3C are disposed at a substantially equal space with each other.

Since narrower and wider spaces are not formed by disposing the inner leads 3A at an equal space, voids can be prevented from being generated at the bonding interface between the main area of the semiconductor chip 1 and the insulating film 4.

Since the electric capacitances for the respective inner leads 3 are made equal to one another by disposing the inner leads 3A in an equal spaced manner, influence by noises can be reduced and increase in the signal transmission rate can be achieved.

Bonding between the active area of the semiconductor chip 1 and the insulating film 4 and between the insulating film 4 and the inner leads 3A is performed with a bonding agent. The bonding agent not be used for bonding the active area of the semiconductor chip 1 to the insulating film 4, but may be used for only bonding the insulating film 4 to the inner leads 3A.

A method of bonding and securing of the semiconductor chip 1 by interposing the insulating film 4 between the semiconductor chip 1 and the leadframe 3 and by using a bonding agent will now be described.

Figure 5:
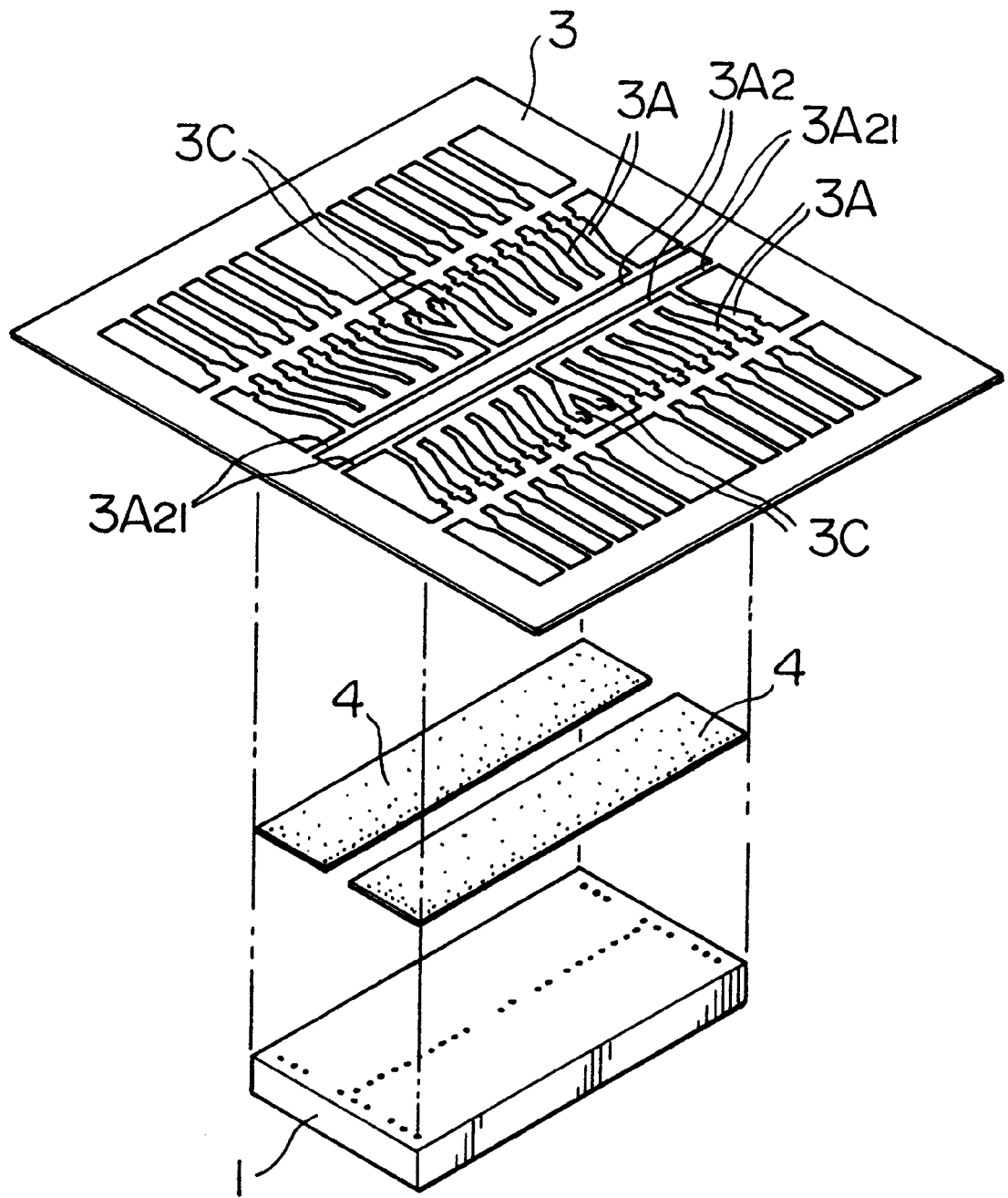
FIG. 5 is an exploded view showing a relation among a semiconductor chip, an insulator and the leadframe shown in FIG. 1.
Figure 6:
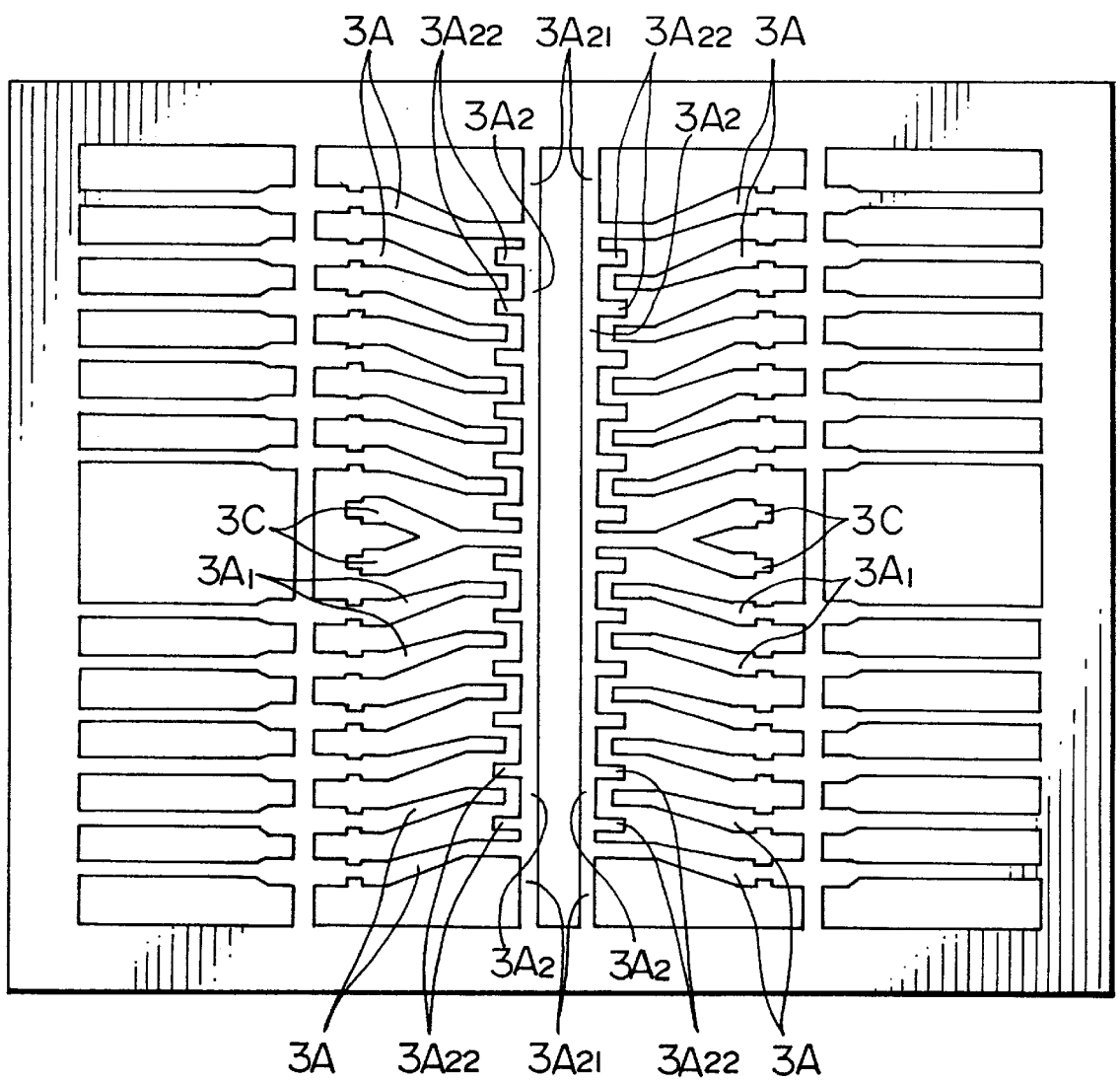
FIG. 6 is a plan view showing the entire of the leadframe of a resin molded semiconductor device of another embodiment of the present invention in which a DRAM is molded.

As shown in FIG. 5 which is an exploded view showing the relations among the leadframes 3, the insulating film 4 and the semiconductor chip 1, the inner leads 3A, common inner leads $3A_2$, support leads $3A_{21}$ and dummy leads 3C of the leadframe 3 are bonded and secured to those portions of the active area of the semiconductor chip 1 which correspond thereto with the insulating film 4 interposed therebetween by the use of a bonding agent.

As is apparent from the above description, the support leads $3A_{21}$ and dummy leads 3C which do not serve to conduct the electrical signals from the common inner lead $3A_2$ are formed integrally with the common inner leads $3A_2$ in accordance with the present embodiment I. This causes the heat to be dissipated from these leads $3A_{21}$ and leads 3C so that the heat dissipation efficiency can be increased.

Furthermore, since the support leads $3A_{21}$ are formed integrally with the common inner leads $3A_{21}$, the structure of the support leads can be made simple.

Furthermore, since the inner leads 3A, the common inner leads $3A_2$ and the dummy leads 3C are disposed in an equal spaced relationship with each other, increase in the signal transmission rate and reduction of electrical noise can be achieved by a stray capacitance between the semiconductor chip and the leads.

These can enhance the reliability of the semiconductor device.

It should be noted that a single common inner lead may be provided in place of the two common inner leads $2A_2$.

[Embodiment II]

A resin molded semiconductor device of an embodiment II of the present invention is identical with the semiconductor device of the embodiment I shown in FIGS. 1 through 4 except that the common inner leads $3A_2$ of the embodiment I is provided with a plurality of projections $3A_{22}$ at their sides for increasing the surface area.

Increase in the surface area by providing the common inner leads $3A_2$ with a plurality of projections $3A_{22}$ in such a manner that they increase the area of the common inner leads $3A_2$ than an area necessary for wire bonding, resulting in further enhancement in heat dissipation efficiency.

This can enhance the reliability of the semiconductor device.

[Embodiment III]

Figure 7:
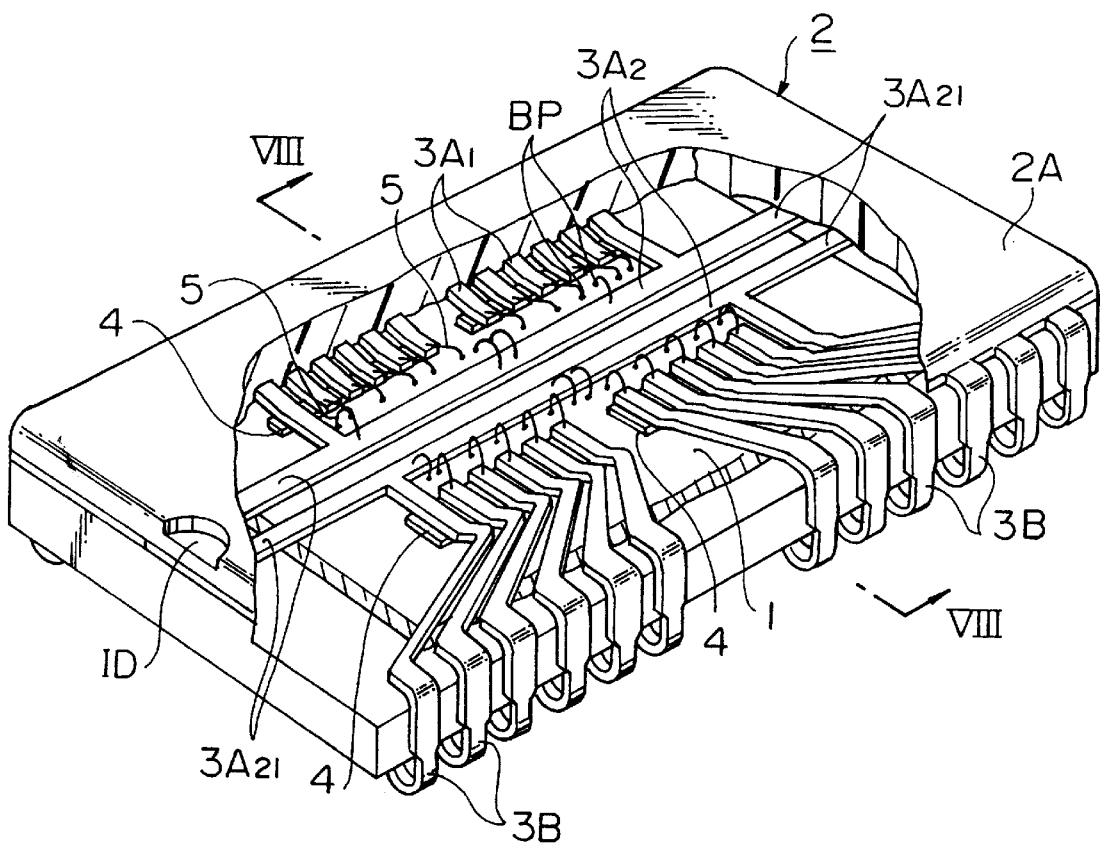
FIG. 7 is a partial sectional and perspective view of a resin molded semiconductor device of another embodiment of the present invention in which a DRAM is molded.
Figure 8:
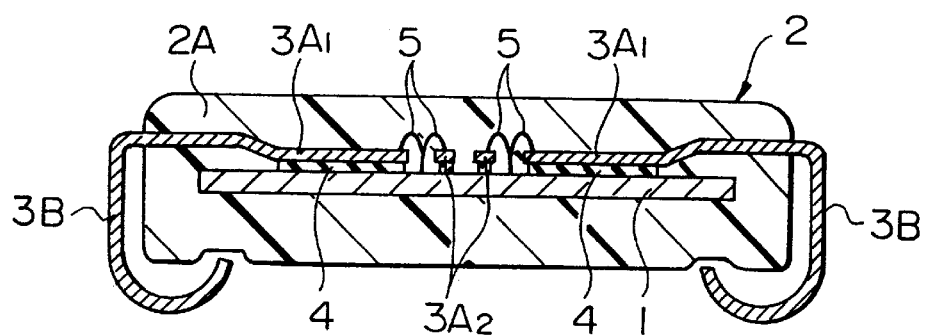
FIG. 8 is a sectional view taken along a line VIII—VIII in FIG. 7.

As shown in FIG. 7 (a partial sectional and perspective view) and FIG. 8 (sectional view taken along a line XIII—XIII in FIG. 7), a resin molded semiconductor device of an embodiment III of the present invention comprises a plurality of signal inner leads 3A, common inner leads $3A_2$ and support leads $3A_{21}$ which are bonded with a bonding agent to the active area of the semiconductor chip 1 of the embodiment I shown in FIG. 1 with an insulating film interposed therebetween. The signal inner leads $3A_1$, the common inner leads $3A_2$ and the semiconductor chip 1 are electrically connected with each other through bonding wires. The semiconductor chip 1 and the leads $3A_1$, $3A_2$ and $3A_{21}$ and the bonding wires 5 are molded with a resin. Bonding pads are arranged on the active area of the semiconductor chip 1 such that the bonding wires 5 do not cross the common inner leads $3A_2$.

Figure 9:
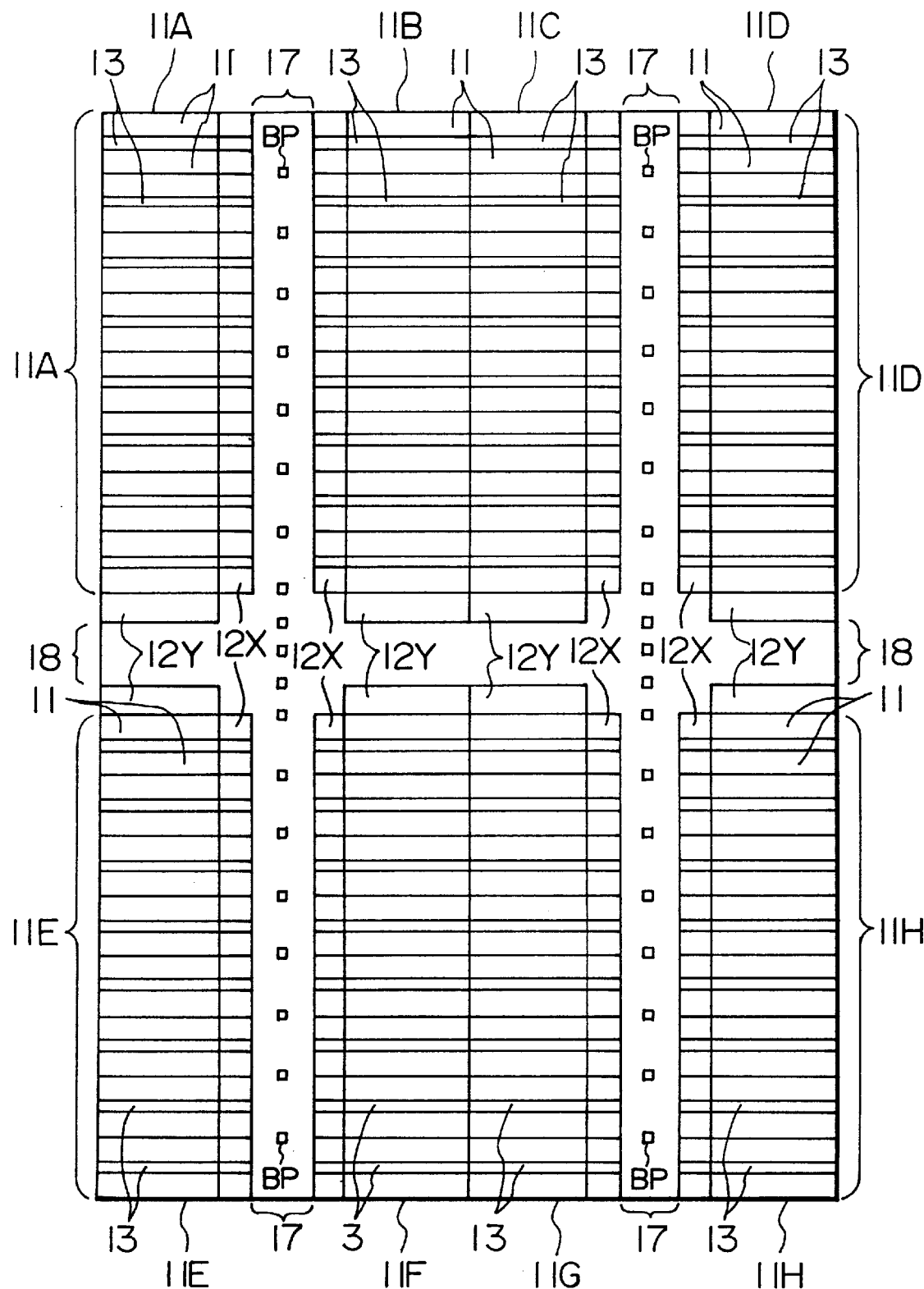
FIG. 9 is a layout plan view showing the element layout and bonding pads BP.

Element layout and bonding pads BP of the semiconductor chip 1 of the present embodiment III are shown in FIG. 9 (plan view).

A memory cell array (MA) is disposed on the substantially entire of the surface of the DRAM1. The DRAM1 of the present embodiment is not limited to this arrangement of the memory cell array (MA). The memory cell array is largely divided into 8 memory cell array units 11A through 11H. In FIG. 9, four memory cell array units 11A, 11B, 11C and 11D are disposed at the upper side of the drawing and four memory cell array units 11E, 11F, 11G and 11H are disposed at the lower side of the drawing. Each of the eight divided memory cell array units 11A through 11H are further segmented into sixteen memory cell array (MA) elements 11. That is, the DRAM1 comprises 128 memory cell array elements 11. Each of the segmented 128 memory cell array elements 11 has a capacity of 128 K bits.

A sense amplifier circuit (SA) 13 is disposed between two memory cell array elements 11 of the segmented 128 memory cell array elements of the DRAM1. The sense amplifier circuit 13 comprises a complimentary MOSFETs (CMOS). Column address decoder circuits (YDEC) 12Y and row address decoder circuits (XDEC) 12X are disposed at end and side portions of each of the memory cell array units 11A, 11B, 11C and 11D. Similarly, column address decoder circuits (YDEC) 12Y and row address decoder circuits (XDEC) 12X are disposed at end and side portions of each of the memory cell array units 11E, 11F, 11G and 11H.

Peripheral circuits 17 and external terminals BP are disposed between the memory cell array units 11A and 11B, between the memory cell array units 11C and 11D, between the memory cell array units 11E and 11F, and between the memory cell array units 11G and 11H. Peripheral circuits 18 are provided at areas on the lower side of the memory cell array units 11A, 11B, 11C and 11D and at area on the upper side of the memory cell array units 11E, 11F, 11G and 11H. Each of peripheral circuits 17 mainly includes a main amplifier circuit, an output buffer circuit, a substrate potential generating circuit ($V_{BB}$ generator circuit) and a power source circuit.

The peripheral circuit 18 mainly includes a row address strobe (12E) system circuit, a write enable (W) system circuit, a data input buffer circuit, a Vcc limiter circuit, an X (row) address driver circuit (logical stage), an X system redundancy circuit, an X address buffer circuit, a column address strobe (CE) system circuit, a test circuit, a VDL limiter circuit, a Y (column) address driver circuit (logical stage), a Y system redundancy circuit, a Y address buffer circuit, a Y address driver circuit (driver stage) and mat selection signal circuit (driver stage).

Since the resin molded semiconductor device 2 is formed in an LOC structure and the inner leads 3A extend to the center of the DRAM1, the external terminals BP are disposed at the center of the DRAM1 is arranged on the active area of the semiconductor chip 1 so that the bonding wires and the common inner leads $3A_2$ provided on the active area of the chip 1 do not cross each other.

The external terminals BP are at the prescribed areas of the memory cell array units 11A, 11B, 11C, 11D, 11E, 11F, 11G and 11H from the upper end of the DRAM1 to the lower end of the DRAM1.

Since the signals applied to the external terminals BP have been described with reference to the resin molded semiconductor device 2 shown in FIG. 1, description of the signals will be omitted herein.

Since the inner leads 3A to which the reference voltage (Vss) and the power source voltage (Vcc) are applied, respectively extend on the surface of the DRAM1 basically from the upper end to the lower end thereof, the DRAM1 has a plurality of external terminals BP for the reference voltage (Vss) and the power source voltage (Vcc) disposed thereon in a direction of extending of the inner leads 3A. That is, the DRAM1 is formed in such a manner that the reference voltage (Vss) and the power source voltage (Vcc) are sufficiently supplied to the DRAM1.

Since the bonding pads BP are arranged on the active area of the semiconductor chip 1 in accordance with the present embodiment III as mentioned above such that the bonding wires 5 and the common inner leads 3A provided on the active area of the chip 1 do not cross each other, short-circuiting between the bonding wires 5 for connecting a plurality of signal inner leads $3A_1$ with the semiconductor chip 1 and the common inner leads $3A_2$ can be prevented.

Figure 10:
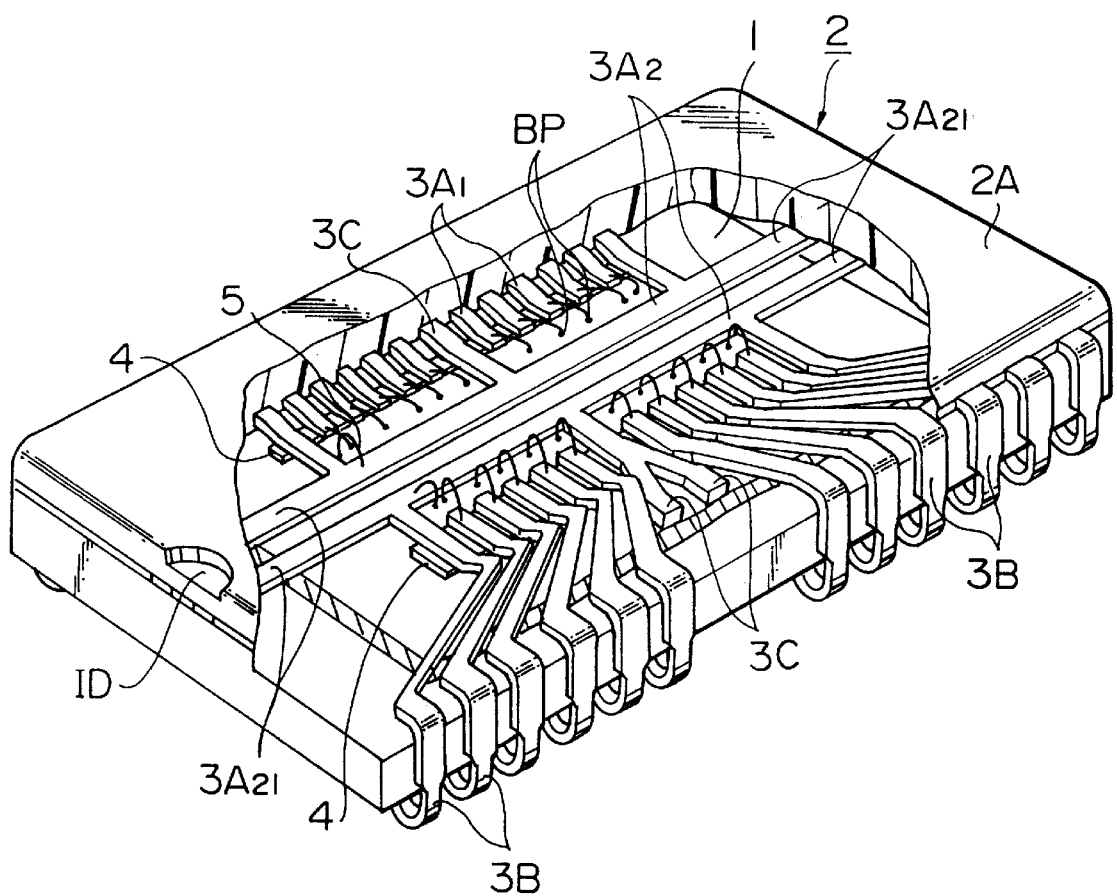
FIG. 10 is a partial sectional and perspective view of the resin molded semiconductor device of FIG. 7 in which dummy leads are provided.

As shown in FIG. 10, dummy leads 3C may be provided in the center of the common inner leads $3A_{21}$ of the resin molded semiconductor device of FIG. 7 for increasing the heat dissipation efficiency.

This can enhance the reliability of the semiconductor device.

Having described the present invention in detail with reference to the embodiments, the present invention is not limited to the above mentioned embodiments. It is apparent that various modifications are possible within the sprit and scope of the invention.

What is claimed is:

1. A method of manufacturing a packaged semiconductor device, comprising the steps of:
   (a) providing a rectangular-shaped semiconductor chip having a main surface with integrated circuits and bonding pads, and a lead frame,
   said lead frame having:
     a first pair of outer frames extending in a first direction and being spaced from each other,
     a second pair of outer frames extending in a second direction substantially perpendicular to said first direction and being spaced from each other, said first and second pairs of outer frames being continuous with one another and forming a rectangular-shaped ring,
     a common potential lead arranged in said rectangular-shaped ring, said common potential lead including a first portion extending in said second direction and a second portion extending in said first direction, one end of said second portion of said common potential lead being continuous with one of said second pair of outer frames, signal leads arranged between one of said second pair of outer frames and said first portion of said common potential lead, and extending in said first direction, each of said signal leads extending from said one of said second pair of outer frames toward said first portion of said common potential lead and having a first end portion in a vicinity of said first portion of said common potential lead, and a chip supporting lead connecting said common potential lead with one of said first pair of outer frames, wherein said common potential lead, said chip supporting lead and said one of said first pair of outer frames are continuous with one another;

(b) fixing said main surface of said rectangular-shaped semiconductor chip to said common potential lead of said lead frame;

(c) electrically connecting said bonding pads with first end portions of said signal leads by bonding wires;

(d) sealing said rectangular-shaped semiconductor chip, said bonding wires, a part of each of said signal leads and a part of said common potential lead with a resin member; and (e) cutting said chip supporting lead such that said common potential lead and said one of said first pair of outer frames are separated from each other.

2. A method of manufacturing a packaged semiconductor device according to claim 1, wherein in the step (b), said rectangular-shaped semiconductor chip and said common potential lead of said lead frame are fixed by an insulating film interposed therebetween.

3. A method of manufacturing a packaged semiconductor device according to claim 1, wherein said chip supporting lead and said first portion of said common potential lead are extended in a substantially straight line in said second direction.

4. A method of manufacturing a packaged semiconductor device according to claim 1, wherein said resin member has a rectangular shape with longer and shorter sides, in accordance with a shape of said rectangular-shaped semiconductor chip, and wherein said chip supporting lead protrudes from one of the shorter sides of said resin member of said rectangular shape.

5. A method of manufacturing a packaged semiconductor device according to claim 1, wherein in the step (b), said main surface of said rectangular-shaped semiconductor chip is fixed to both said common potential lead and said signal leads.

6. A method of manufacturing a packaged semiconductor device according to claim 1, wherein said common potential lead further includes projections protruding from a side of said first portion toward said one of said second pair of outer frames, wherein said projections are arranged at a predetermined interval in said second direction, and wherein each of said projections has an end portion which terminates over said main surface of said rectangular-shaped semiconductor chip.

7. A method of manufacturing a packaged semiconductor device according to claim 1, further comprising a step of cutting a boundary of each of said signal leads and said one of said second pair of outer frames, and a step of cutting a boundary of said second portion of said common potential lead and said one of said second pair of outer frames, respectively, such that said signal leads and said one of said second pair of outer frames are separated from each other, and said second portion of said common potential lead and said one of said second pair of outer frames are separated from each other.

8. A method of manufacturing a packaged semiconductor device, comprising the steps of:

(a) providing a rectangular-shaped semiconductor chip having a main surface with integrated circuits and bonding pads, and a lead frame, said lead frame having:

a first pair of outer frames extending in a first direction and being spaced from each other, a second pair of outer frames extending in a second direction substantially perpendicular to said first direction and being spaced from each other, said first and second pairs of outer frames being continuous with one another and forming a rectangular-shaped ring, a first common potential lead and a second common potential lead each arranged in said rectangular-shaped ring, each of said first and second common potential leads including a first portion extending in said second direction and a second portion extending in said first direction, one end of said second portion of said first common potential lead being continuous with one of said second pair of outer frames, one end of said second portion of said second common potential lead being continuous with the other of said second pair of outer frames, first signal leads arranged between said one of said second pair of outer frames and said first portion of said first common potential lead and extending in said first direction, each of said first signal leads extending from said one of said second pair of outer frames toward said first portion of said first common potential lead and having a first end portion in a vicinity of said first portion of said first common potential lead, second signal leads arranged between the other of said second pair of outer frames and said first portion of said second common potential lead and extending in said first direction, each of said second signal leads extending from the other of said second pair of outer frames toward said first portion of said second common potential lead and having a first end portion in a vicinity of said first portion of said second common potential lead, a first chip supporting lead connecting said first common potential lead with one of said first pair of outer frames, wherein said first common potential lead, said first chip supporting lead and said one of said first pair of outer frames are continuous with one another, and a second chip supporting lead connecting said second common potential lead with said one of said first pair of outer frames, wherein said second common potential lead, said second chip supporting lead and said one of said first pair of outer frames are continuous with one another;

(b) fixing said main surface of said rectangular-shaped semiconductor chip to said first and second common potential leads of said lead frame;

(c) electrically connecting said bonding pads with first end portions of said first and second signal leads by bonding wires;

(d) sealing said rectangular-shaped semiconductor chip, said bonding wires, a part of each of said first and second signal leads and a part of said first and second common potential leads with a resin member; and (e) cutting said first and second chip supporting leads such that each of said first and second common potential leads and said one of said first pair of outer frames are separated from each other.

9. A method of manufacturing a packaged semiconductor device according to claim 8, wherein in the step (b), said rectangular-shaped semiconductor chip and said first and second common potential leads of said lead frame are fixed by an insulating film interposed therebetween.

10. A method of manufacturing a packaged semiconductor device according to claim 8, wherein said first chip supporting lead and said first portion of said first common potential lead are extended in a substantially straight line in said second direction, and wherein said second chip supporting lead and said first portion of said second common potential lead are extended in a substantially straight line in said second direction.

11. A method of manufacturing a packaged semiconductor device according to claim 8, wherein said bonding pads are arranged at a substantially central position of said rectangular-shaped semiconductor chip, said bonding pads extending in a direction of longer sides of said rectangular-shaped semiconductor chip, and wherein in the step (b), said rectangular-shaped semiconductor chip is arranged on said first and second signal leads and said first and second common potential leads such that said bonding pads are arranged along said first portions of said first and second common potential leads.

12. A method of manufacturing a packaged semiconductor device according to claim 8, wherein said resin member has a rectangular shape, with longer and shorter sides, in accordance with a shape of said rectangular-shaped semiconductor chip, and wherein each of said first and second chip supporting leads protrudes from one of the shorter sides of said resin member of said rectangular shape.

13. A method of manufacturing a packaged semiconductor device according to claim 9, wherein in the step (b), said main surface of said rectangular-shaped semiconductor chip is fixed to both said first and second common potential leads and said first and second signal leads.

14. A method of manufacturing a packaged semiconductor device according to claim 8, wherein said first common potential lead further includes first projections protruding from a side of said first portion toward said one of said second pair of outer frames, wherein said second common potential lead further includes second projections protruding from a side of said first portion toward the other of said second pair of outer frames, wherein each of said first and second projections is arranged at a predetermined interval in said second direction, and wherein each of said first and second projections has an end portion which terminates over said main surface of said rectangular-shaped semiconductor chip.

15. A method of manufacturing a packaged semiconductor device according to claim 11, wherein said first common potential lead is a lead for providing a power supply potential, and wherein said second common potential lead is a lead for providing a ground potential.

16. A method of manufacturing a packaged semiconductor device according to claim 15, wherein first ones of said bonding wires jump over said first portion of said first common potential lead, and wherein second ones of said bonding wires jump over said first portion of said second common potential lead.

17. A method of manufacturing a packaged semiconductor device according to claim 16, further including a step of electrically connecting first ones of said bonding pads with said first common potential lead and a step of electrically connecting second ones of said bonding pads with said second common potential lead, by bonding wires, respectively.

18. A method of manufacturing a packaged semiconductor device, comprising the steps of:

(a) providing a rectangular-shaped semiconductor chip having a main surface with integrated circuits and bonding pads, and a lead frame, said lead frame having:
a first pair of outer frames extending in a first direction and being spaced from each other,
a second pair of outer frames extending in a second direction substantially perpendicular to said first direction and being spaced from each other, said first and second pairs of outer frames being continuous with one another and forming a rectangular-shaped ring,
a first common potential lead and a second common potential lead each arranged in said rectangular-shaped ring, each of said first and second common potential leads including a first portion extending in said second direction and second portions extending in said first direction, first ends of said second portions of said first common potential lead being continuous with one of said second pair of outer frames, first ends of said second portions of said second common potential lead being continuous with the other of said second pair of outer frames,
first signal leads arranged between said one of said second pair of outer frames and said first portion of said first common potential lead and extending in said first direction, each of said first signal leads extending from said one of said second pair of outer frames toward said first portion of said first common potential lead and having a first end portion in a vicinity of said first portion of said first common potential lead,
second signal leads arranged between the other of said second pair of outer frames and said first portion of said second common potential lead and extending in said first direction, each of said second signal leads extending from the other of said second pair of outer frames toward said first portion of said second common potential lead and having a first end portion in a vicinity of said first portion of said second common potential lead,
a first chip supporting lead connecting said first common potential lead with one of said first pair of outer frames, wherein said first common potential lead, said first chip supporting lead and said one of said first pair of outer frames are continuous with one another,
a second chip supporting lead connecting said second common potential lead with said one of said first pair of outer frames, wherein said second common potential lead, said second chip supporting lead and said one of said first pair of outer frames are continuous with one another,
a third chip supporting lead connecting said first common potential lead with the other of said first pair of outer frames, wherein said first common potential lead, said third chip supporting lead and the other of said first pair of outer frames are continuous with one another, and
a fourth chip supporting lead connecting said second common potential lead with the other of said first pair of outer frames, wherein said second common potential lead, said fourth chip supporting lead and the other of said first pair of outer frames are continuous with one another;

(b) fixing said main surface of said rectangular-shaped semiconductor chip to said first and second common potential leads of said lead frame;

(c) electrically connecting said bonding pads with first end portions of said first and second signal leads by bonding wires;

(d) sealing said rectangular-shaped semiconductor chip, said bonding wires, a part of each of said first and second signal leads and a part of said first and second common potential leads with a resin member; and (e) cutting said first to fourth chip supporting leads such that each of said first and second common potential leads and said one of said first pair of outer frames are separated from each other, and each of said first and second common potential leads and the other of said first pair of outer frames are separated from each other.

19. A method of manufacturing a packaged semiconductor device according to claim 18, wherein in the step (b), said rectangular-shaped semiconductor chip and said first and second common potential leads of said lead frame are fixed by an insulating film interposed therebetween.

20. A method of manufacturing a packaged semiconductor device according to claim 18, wherein said first chip supporting lead, said third chip supporting lead and said first portion of said first common potential lead are extended in a substantially straight line in said second direction, and wherein said second chip supporting lead, said fourth chip supporting lead and said first portion of said second common potential lead are extended in a substantially straight line in said second direction.

21. A method of manufacturing a packaged semiconductor device according to claim 18, wherein said bonding pads are arranged at a substantially central position of said rectangular-shaped semiconductor chip, said bonding pads extending in a direction of longer sides of said rectangular-shaped semiconductor chip, and wherein in the step (b), said rectangular-shaped semiconductor chip is arranged on said first and second signal leads and said first and second common potential leads such that said bonding pads are arranged along said first portions of said first and second common potential leads.

22. A method of manufacturing a packaged semiconductor device according to claim 18, wherein said resin member has a rectangular shape, with longer and shorter sides, in accordance with a shape of said rectangular-shaped semiconductor chip, and wherein each of said first and second chip supporting leads protrudes from one of the shorter sides of said resin member of said rectangular shape, and each of said third and fourth chip supporting leads protrudes from the other of the shorter sides of said resin member of said rectangular shape.

23. A method of manufacturing a packaged semiconductor device according to claim 18, wherein in the step (b), said main surface of said rectangular-shaped semiconductor chip is fixed to both said first and second common potential leads and said first and second signal leads.

24. A method of manufacturing a packaged semiconductor device according to claim 18, wherein said first common potential lead further includes first projections protruding from a side of said first portion toward said one of said second pair of outer frames, wherein said second common potential lead further includes second projections protruding from a side of said first portion toward the other of said second pair of outer frames, wherein each of said first and second projections are arranged at a predetermined interval in said second direction, and wherein each of said first projections and each of said second projections has an end portion which terminates over said main surface of said rectangular-shaped semiconductor chip.

25. A method of manufacturing a packaged semiconductor device according to claim 21, wherein said first common potential lead is a lead for providing a power supply potential, and wherein said second common potential lead is a lead for providing a ground potential.

26. A method of manufacturing a packaged semiconductor device according to claim 25, wherein first ones of said bonding wires jump over said first portion of said first common potential lead, and wherein second ones of said bonding wires jump over said first portion of said second common potential lead.

27. A method of manufacturing a packaged semiconductor device according to claim 26, further including a step of electrically connecting first ones of said bonding pads with said first common potential lead and a step of electrically connecting second ones of said bonding pads with said second common potential lead, by bonding wires, respectively.

* * * * *